(12) United States Patent
Matsumoto et al.

(10) Patent No.: US 9,520,456 B2
(45) Date of Patent: Dec. 13, 2016

(54) ORGANIC EL DISPLAY DEVICE AND METHOD OF MANUFACTURING ORGANIC EL DISPLAY DEVICE

(71) Applicant: Japan Display Inc., Tokyo (JP)

(72) Inventors: Yuko Matsumoto, Tokyo (JP); Toshihiro Sato, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 14/469,628

(22) Filed: Aug. 27, 2014

(65) Prior Publication Data
US 2015/0060816 A1 Mar. 5, 2015

(30) Foreign Application Priority Data
Aug. 29, 2013 (JP) .................................. 2013-178680

(51) Int. Cl.
*H01L 51/50* (2006.01)
*H01L 27/32* (2006.01)

(52) U.S. Cl.
CPC ....... *H01L 27/3276* (2013.01); *H01L 27/3246* (2013.01)

(58) Field of Classification Search
CPC .. H01L 27/3246; H01L 27/3244; H01L 51/56; H01L 51/5253; H01L 27/3276; H01L 27/3262
USPC ...... 313/506, 504, 512, 503; 257/98; 445/25
See application file for complete search history.

(56) References Cited

U.S. PATENT DOCUMENTS

| 5,625,474 | A   | * | 4/1997  | Aomori   | G02F 1/1347 349/139 |
| 6,844,957 | B2  | * | 1/2005  | Matsumoto | G02F 1/1347 349/74 |
| 7,633,218 | B2  | * | 12/2009 | Cok      | H01L 27/3209 313/500 |
| 8,324,805 | B2  | * | 12/2012 | Hayashi  | H01L 51/5237 313/504 |
| 8,710,520 | B2  | * | 4/2014  | Kim      | H01L 33/08 257/89 |
| 2003/0048072 | A1 | * | 3/2003  | Ishihara | H01L 51/5237 313/506 |
| 2011/0121276 | A1 | * | 5/2011  | Hayashi  | H01L 51/5237 257/40 |

FOREIGN PATENT DOCUMENTS

JP 2004-207217 A 7/2004
JP 2011-221203 A 11/2011

* cited by examiner

*Primary Examiner* — Mary Wilczewski
*Assistant Examiner* — Tsz Chiu
(74) *Attorney, Agent, or Firm* — Typha IP LLC (57) ABSTRACT

An organic EL display device includes: a lower electrode; an upper electrode; a first organic layer which is disposed between the lower electrode and the upper electrode and is formed of a plurality of layers including a light emitting layer formed of an organic material that emits light; a metal wire that extends between the pixels within the display region; and a second organic layer which is formed of a plurality of layers the same as that of the first organic layer and which comes into contact with a part of the metal wire and does not come into contact with the first organic layer. The upper electrode comes into contact with the metal wire in the periphery of the second organic layer. Accordingly, it is possible to uniformise the potential of the upper electrode without reducing the light emission area.

5 Claims, 6 Drawing Sheets

ORGANIC EL DISPLAY DEVICE AND METHOD OF MANUFACTURING ORGANIC EL DISPLAY DEVICE

CROSS-REFERENCE TO RELATED APPLICATION

The present application claims priority from Japanese application JP2013-178680 filed on Aug. 29, 2013, the content of which is hereby incorporated by reference into this application.

BACKGROUND OF THE INVENTION

1. Field of the Invention

The present invention relates to an organic EL display device and a method of manufacturing the organic EL display device, and more specifically, to an organic EL display device that performs display by emitting light on a light emitting element which is a self-luminous body disposed in each pixel, and a method of manufacturing the same.

2. Description of the Related Art

In recent years, an image display device (hereinafter, referred to as "organic EL (Electro-luminescent) display device") using a self-luminous body called organic light emitting diode (OLED) is in practical use. Since the organic EL display device uses the self-luminous body, it is not only excellent in terms of visibility and response speed, but it is also possible to make the device thinner because an auxiliary illuminating device such as a backlight is not required, compared to a liquid crystal display in the related art.

In a display device in which light is emitted to a side on which alight emitting element of an insulated substrate is formed, that is, a top emission type display device, among an upper electrode and a lower electrode as two electrodes that sandwich an organic layer having at least a light emitting layer as a layer, the upper electrode is an electrode, which covers the entire surface of a display region on which the organic layer is formed, and is formed of a transparent conductive material. It is desired that the upper electrode be formed thinner in order to improve transmittance of light. However, the thinner the upper electrode is, the higher the resistance value is and the lower the voltage is. Therefore, luminance unevenness easily occurs at the end portion and the center of the display region.

JP 2004-207217 A discloses that an upper electrode is brought into contact with an auxiliary electrode in a layer which is the same as that of a lower electrode within a display region, through a connection hole and that the resistance of the upper electrode is reduced. JP 2011-221203 A discloses that an upper electrode is electrically connected to a conductive substrate through a connection hole within a display region.

SUMMARY OF THE INVENTION

Bringing the upper electrode into contact with the electrode of a metal having a high conductivity within the display region as disclosed in the above JP 2004-207217 A and JP 2011-221203 A is effective for reducing the resistance of the upper electrode and for uniformizing potential. However, in both cases, the connection hole is required for the organic layer. Therefore, in consideration of deposition precision of the organic layer formed using a deposition mask, it is difficult to open a highly precise hole and a connection hole which is opened in each pixel has a certain size. However, this reduces the area of a portion from which light is emitted, thereby resulting in degradation in a contrast of the display. Particularly, in an organic EL display device having an organic layer that covers the surface of a display region without using a deposition mask, it is difficult to provide the connection hole within the display region.

The invention has been made from the viewpoint of the above-described problems and an object of the invention is to provide an organic EL display device in which a potential of an upper electrode is uniformized without reducing the light emission area.

(1) An organic EL display device includes: a lower electrode which is disposed for every pixel disposed in a matrix shape within a display region and is formed of a conductive material, and in which a potential is controlled for every pixel; an upper electrode which is disposed so as to cover the display region and is formed of the conductive material; a first organic layer which is disposed between the lower electrode and the upper electrode and is formed of a plurality of layers including a light emitting layer formed of an organic material that emits light; a metal wire that extends between the pixels within the display region; and a second organic layer which is formed of a plurality of layers the same as that of the first organic layer and which comes into contact with a part of the metal wire and does not come into contact with the first organic layer. The upper electrode comes into contact with the metal wire in the periphery of the second organic layer.

(2) In (1), the organic EL display device may further includes: a flattening film formed of the organic material covering a circuit which is formed on a substrate and includes the metal wire and a thin film transistor; and an insulating bank that covers an end portion of the lower electrode which is formed on the flattening film among the lower electrode, the first organic layer, and the upper electrode, and electrically insulates the pixels. The upper electrode may come into contact with the metal wire through a contact hole opened in the flattening film and the insulating bank.

(3) In (1) or (2), the upper electrode may continuously come into contact with the metal wire within the display region along the metal wire.

(4) In any one of (1) to (3), the metal wire may vertically and horizontally extend so as to surround each of the pixels within the display region.

(5) In any one of (1) to (4), the first organic layer may have the same light emitting layer in all of the pixels within the display region.

(6) A method of manufacturing an organic EL display device includes: a metal wire formation step of forming a metal wire between pixels in a display region in which the pixels are disposed in a matrix shape; an insulating wire formation step of forming an insulating film using an insulation material so as to cover the display region on the metal wire; a contact hole formation step of forming a contact hole through which at least a part of the metal wire is exposed with respect to the insulating film; an organic layer formation step of simultaneously forming a first organic layer which is disposed on the insulating film and is formed of a plurality of layers including a light emitting layer formed of an organic material that emits light, and a second organic layer which is disposed at the bottom of the contact hole and is discontinuous to the first organic layer; and an upper electrode formation step of forming an upper electrode which is formed of a conductive material and which comes into contact with the metal wire and covers the display region, after the organic layer formation step.

(7) In (6), the method of manufacturing the organic EL display device may further include: a flattening film-formation step of forming a flattening film using the organic material on the metal wire after the metal wire formation step; a flattening film contact hole formation step of forming a contact hole through which the metal wire is exposed with respect to the flattening film; and a lower electrode formation step of forming a lower electrode for every pixels on the flattening film. The insulating film formed in the insulating film formation step may be an insulating bank that electrically insulates the pixels and the contact hole formation step may be an insulating bank contact hole formation step performed on the insulating bank.

(8) In (6) or (7), the organic layer formation step may be a step of forming an organic layer through a deposition method and the upper electrode formation step may be a step of forming the upper electrode through a sputtering method.

DETAILED DESCRIPTION OF THE INVENTION

Hereinafter, an embodiment of the invention will be described with reference to the accompanying drawings. In the drawings, the same components will be denoted by the same reference numerals throughout and the detailed description thereof will be omitted.

Figure 1:
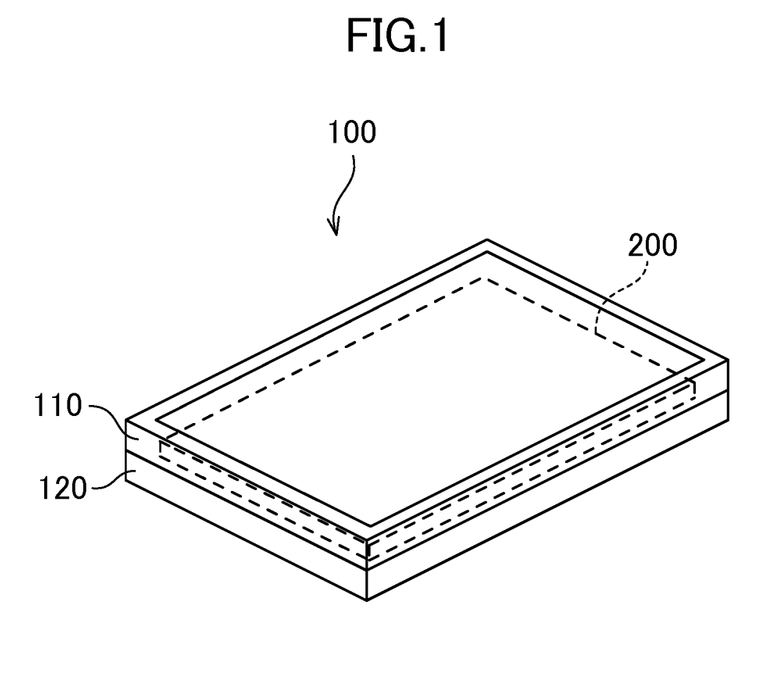
FIG. 1 is a view schematically showing an organic EL display device according to an embodiment of the invention.

FIG. 1 schematically shows an organic EL display device 100 according to the embodiment of the invention. As shown in FIG. 1, the organic EL display device 100 is formed of an organic EL panel 200 which is fixed so as to be interposed between an upper frame 110 and a lower frame 120.

Figure 2:
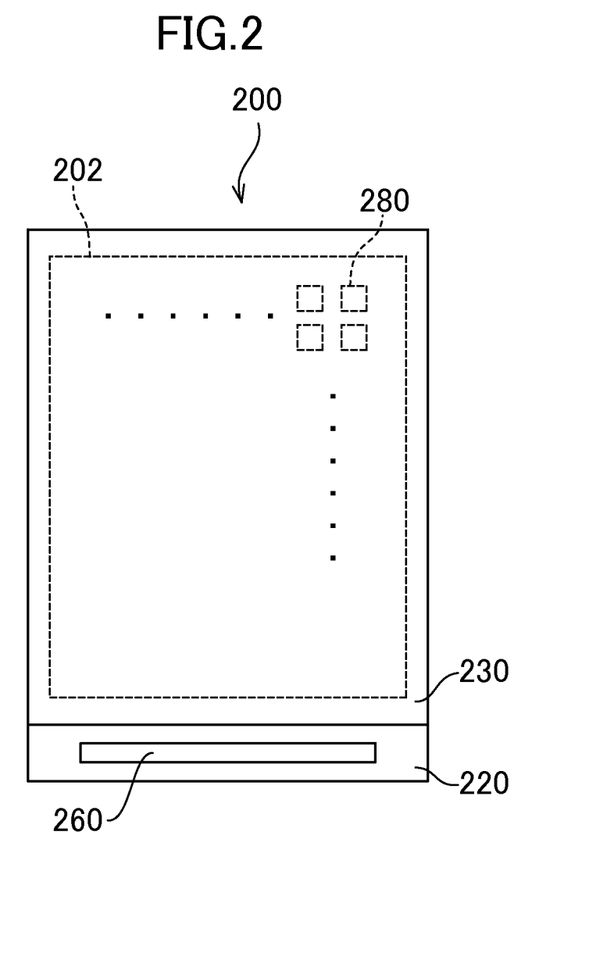
FIG. 2 is a view showing a configuration of an organic EL panel of FIG. 1.

FIG. 2 shows a configuration of the organic EL panel 200 of FIG. 1. The organic EL panel 200 has two substrates which are a thin film transistor (TFT) substrate 220 and a sealing substrate 230 and transparent resin (not shown) is filled between these substrates. The TFT substrate 220 has pixels 280 arranged in a display region 202 in a matrix shape. In addition, a driving IC (integrated circuit) 260 which is a driving circuit that applies a potential for electrically connecting a source and a drain with respect to a scanning signal line (not shown) of a pixel transistor, the scanning signal line being disposed in each pixel, and applies a voltage corresponding to a gradation value of a pixel with respect to a data signal line of each pixel transistor is mounted on the TFT substrate 220.

Figure 3:
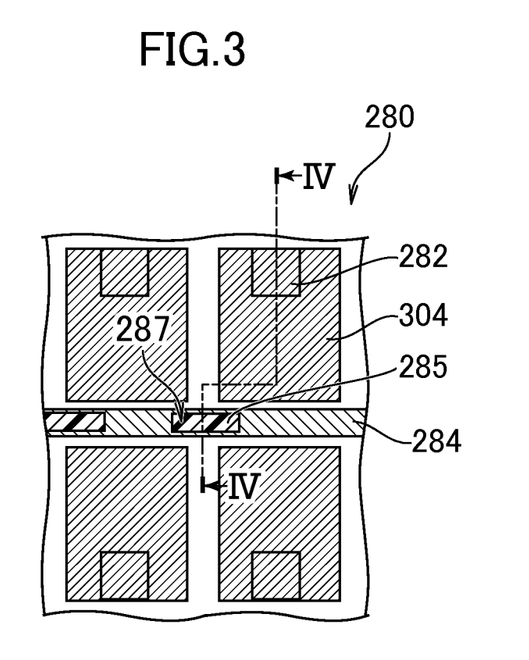
FIG. 3 is an enlarged view schematically showing four pixels of FIG. 2.

FIG. 3 is an enlarged view schematically showing four pixels 280 of FIG. 2. In FIG. 3, in order to describe the present embodiment, only a part of electrodes is shown by a solid line in a planar view regardless of the lamination relation. As shown in FIG. 3, each of the pixels 280 has an independent lower electrode 304 for every pixel 280, and an independent lower electrode contact hole 282 for every pixel 280 in which the lower electrode 304 is connected to source and drain electrodes 309 to be described later. As described below, a first organic layer 306 including a light emitting layer disposed on the entire surface of the display region 202, and an upper electrode 307 disposed on the first organic layer on the entire surface of the display region are disposed on the lower electrode 304 in this order. A metal wire 284 is disposed between the pixels 280 and a second organic layer 285 which has the same layer structure as that of the first organic layer 306 is mounted on the metal wire 284. An upper electrode contact hole 287 is formed such that the upper electrode 307 and the metal wire 284 are connected to each other.

Figure 4:
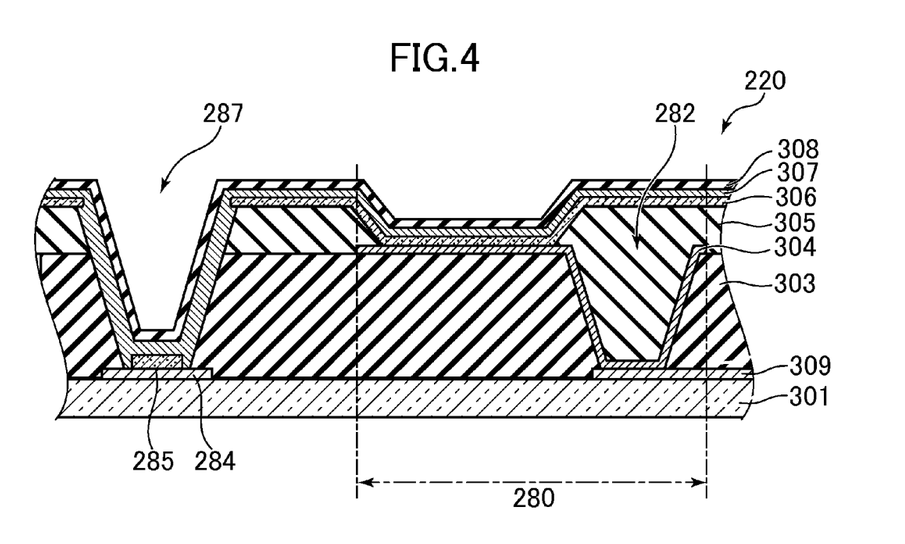
FIG. 4 is a cross-sectional view taken along line IV-IV of FIG. 3.

FIG. 4 is a cross-sectional view taken along line IV-IV of FIG. 3. As shown in FIG. 4, the TFT substrate 220 has a glass substrate 301 which is an insulating substrate; the source and drain electrodes 309 and the metal wire 284 which are formed of a conductive material on the glass substrate 301; a flattening film 303 formed of an insulating material on the source and drain electrodes 309 and the metal wire 284; the lower electrode 304 connected to the source and drain electrodes 309 through a contact hole which is opened in the flattening film 303; an insulating bank 305 which covers an end portion of the lower electrode 304 and insulates between electrodes between pixels; a first organic layer 306 including a light emitting layer and a common layer such as an electron injection layer and a hole transport layer which are formed so as to substantially cover the entire display region 202 on the lower electrode 304 and the insulating bank 305; the upper electrode 307 which is formed so as to cover the entire display region 202 on the first organic layer 306; a sealing film 308 that blocks air or water in order to prevent the first organic layer 306 from deteriorating; and a second organic layer 285 formed on the metal wire 284. Although it is not shown in FIG. 4, the source and drain electrodes 309 are connected to the TFT, which is formed in each of the pixels 280, between the glass substrate 301 and the flattening film 303. The light emitting layer of the first organic layer emits light when a positive hole or an electron which is injected through the lower electrode 304 and an electron or a positive hole which is injected through the upper electrode 307 are recombined, an excited state is formed, and the state is transferred to a ground state.

As shown in FIG. 4, the upper electrode 307 comes into contact with the metal wire 284 disposed between the pixels 280 through the upper electrode contact hole 287. For this reason, the upper electrode 307 of which the resistance value is increased by being thinly formed within the display region 202 can come into contact with the metal wire 284 having high conductivity within the display region 202. Therefore, the potential of the upper electrode 307 is uniformly maintained within the display region 202. The second organic layer 285 is disposed on the metal wire 284 of a region formed with the upper electrode contact hole 287.

Here, the organic EL display device 100 according to the present embodiment is an organic EL display device with a system of emitting light with a uniform wavelength region (for example, W (white)) in the entire surface of the display region, and extracting light at a wavelength region corresponding to RGB using a color filter provided in the sealing substrate 230. However, the organic EL display device is not limited thereto and may be an organic EL display device with a system of emitting light at respective wavelength regions of RGB in the pixels, and extracting light without using the color filter. In this case, the first organic layer including the light emitting layer, and the second organic layer are formed by being painted in a dot shape or a stripe shape for every pixel through deposition or the like.

Figure 5:
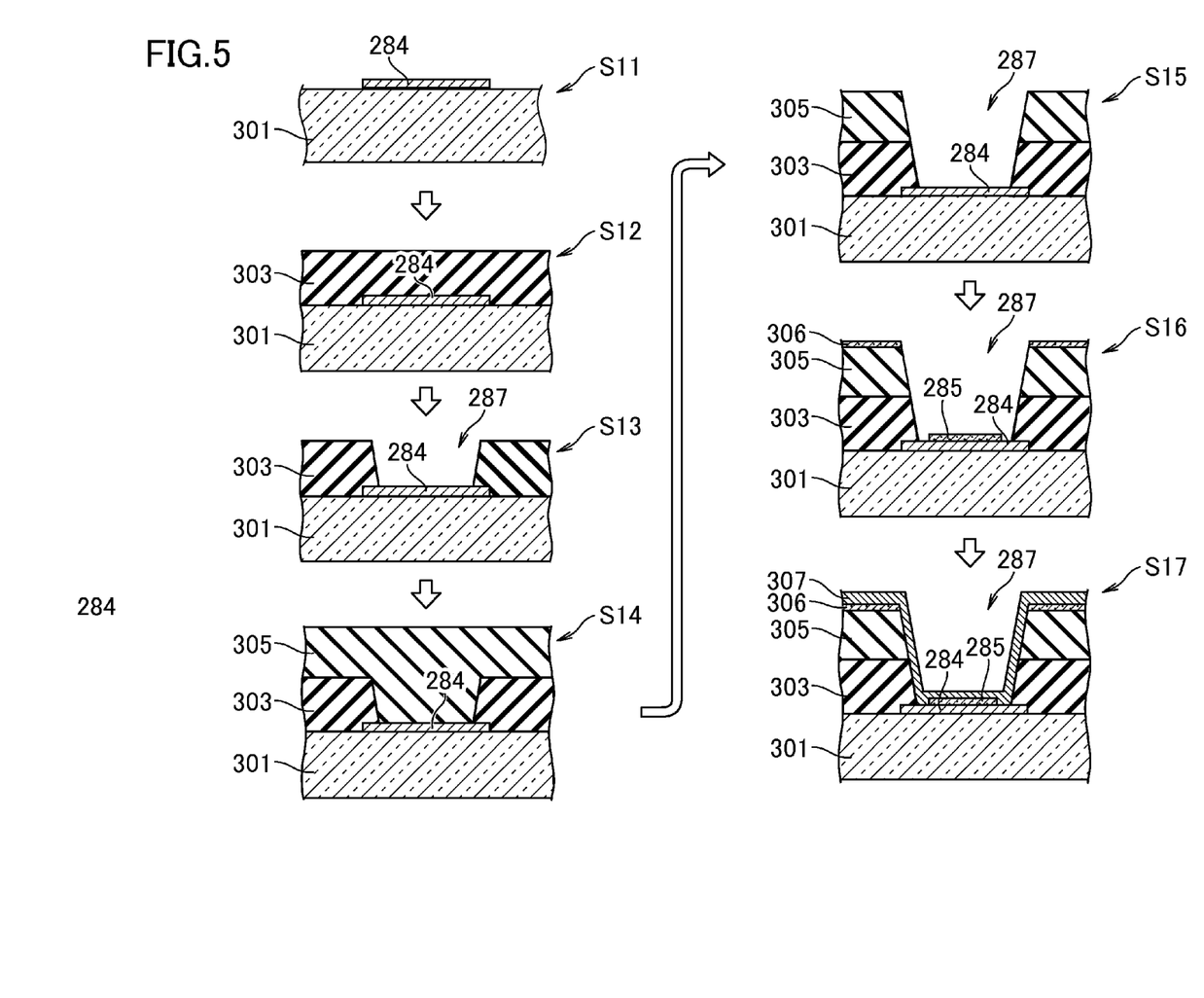
FIG. 5 is a view illustrating a step of forming an upper electrode which is formed in an upper electrode contact hole.

FIG. 5 is a view illustrating a step of forming the upper electrode 307 which is formed in the above-described upper electrode contact hole 287. In the step, first, the metal wire 284 is formed in a metal wire formation step S11. Here, the metal wire 284 (not shown) can be simultaneously formed at the same step with any of a gate electrode, a drain electrode, and a source electrode of the TFT formed in each of the pixels, and other wires except for the TFT. In this case, the metal wire 284 may not only be directly formed on the glass substrate 301, but may also be formed on an insulating film which is formed on the glass substrate 301.

Next, in a flattening film-formation step S12, a flattening film 303 formed of an organic material such as a photosensitive organic material is formed. In a flattening film-contact hole formation step S13, the upper electrode contact hole 287 is formed on the flattening film 303 through a well-known photolithography step to expose the metal wire 284. Then, although it is not shown in FIG. 5, in a lower electrode formation step, the lower electrode 304 is formed within the pixel 280. In an insulating bank-formation step S14, an end portion of the lower electrode 304 is covered and an insulating bank 305 which insulates the pixels and is formed of an organic material or an inorganic material is formed. Subsequently, in an insulating bank-contact hole formation step S15, the upper electrode contact hole 287 is formed in the insulating bank 305 through the well known photolithography step to expose the metal wire 284.

The flattening film 303 can be formed by covering the entire TFT circuit formed on the glass substrate 301 and the upper electrode contact hole 287 of the flattening film 303 can be simultaneously formed in the same step as that of forming the lower electrode contact hole 282 of FIG. 4. In addition, the upper electrode contact hole 287 of the insulating bank 305 can be simultaneously formed with the step of exposing the lower electrode 304 from the insulating bank 305.

In an organic layer formation step S16, the first organic layer 306 and the second organic layer 285 are simultaneously formed through deposition. Here, the first organic layer 306 and the second organic layer 285 are simultaneously formed through the deposition. However, an organic material which is heated in a vacuum is adhered thereto with directivity. Therefore, the first organic layer 306 which is formed on the insulating bank 305 and the second organic layer 285 which is formed on the metal wire 284 are formed as discontinuous layers (stepping structure) by an extremely large step in the upper electrode contact hole 287. The first organic layer 306 and the second organic layer 285 in the present embodiment are set to be formed through the deposition, but can be formed by a formation method such as offset printing so as to make discontinuous layers by providing a step.

Lastly, in an upper electrode formation step S17, the upper electrode 307 is formed through a sputtering method using a transparent electrode such as indium tin oxide (ITO) and indium zinc oxide (InZnO). The transparent electrode formed through the sputtering method has good throwing power compared to the deposition of the organic material. Therefore, the transparent electrode is adhered even to the discontinuous portion between the first organic layer 306 and the second organic layer 285 and is formed as a continuous upper electrode 307 coming into contact with the metal wire 284.

In a subsequent step, a sealing film is formed using SiN or a glass cap which is a well-known step. Therefore, the detailed description thereof will be omitted. In the present embodiment, the upper electrode contact hole 287 is set to be formed in both of the flattening film 303 and the insulating bank 305. However, the metal wire may be formed on the flattening film 303 and the upper electrode contact hole 287 may be formed only in the insulating bank 305, for example.

As described above, in the present embodiment, the upper electrode 307 can be brought into contact with the metal wire 284 having a low resistance value on the glass substrate 301 in the display region 202. Therefore, it is possible to reduce the sheet resistance of the upper electrode 307 and save the power consumption. In addition, partial voltage reduction does not occur in the display region 202, and therefore, it is possible to maintain uniformity of display. Furthermore, it is possible to bring the upper electrode 307 into contact with the metal wire 284 without patterning the first organic layer and the second organic layer. Therefore, it is possible to maintain the area of the light emitting region of the pixel to be large and to make the pixel a high definition pixel without increasing the number of steps. Particularly, it is possible to effectively apply the principle to an organic EL display device which has an organic layer including a light emitting layer formed on the entire surface of a display region 202 or a common layer. However, it is possible to apply the principle even to an organic EL display device formed of light emitting layers mutually having different wavelength regions of emitted light.

Figure 6:
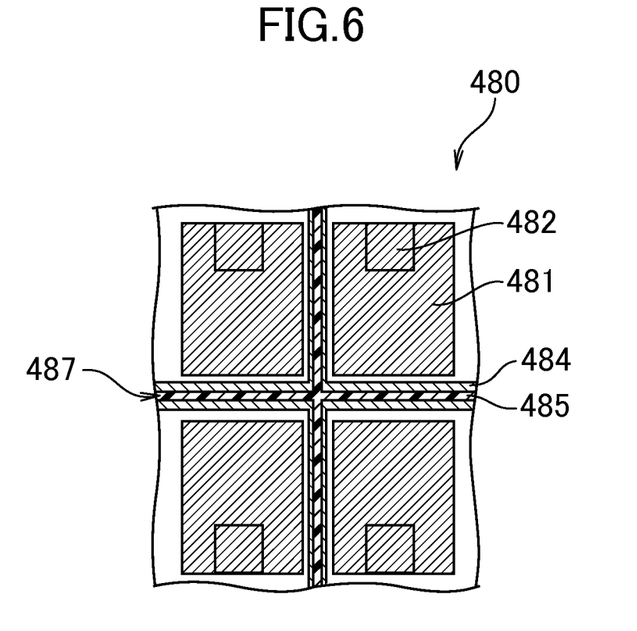
FIG. 6 is an enlarged view schematically showing four pixels of an organic EL display device as a modification example of the present embodiment.

FIG. 6 is an enlarged view schematically showing four pixels 480 of an organic EL display device as a modification example of the present embodiment. Similarly to FIG. 3, in order to describe the present embodiment, only a part of electrodes is shown by a solid line in a planar view regardless of the lamination relation. Similarly to the above-described embodiment, each of pixels 480 has a lower electrode 481 and a lower electrode contact hole 482. Points different from the above-described embodiment is that a metal wire 484 which is connected to an upper electrode 407 is vertically and horizontally disposed between the pixels 480, and an upper electrode contact hole 487 and a second organic layer 485 which is formed on the upper electrode contact hole 487 are also vertically and horizontally disposed along the metal wire 484. Even in this case, in order to ensure the opening ratio, it is desirable that the area of the upper electrode contact hole 487 be smaller than or equal to 10% of the area of the lower electrode 481.

With such a configuration, the first organic layer becomes an independent discontinuous layer (stepping structure) for every pixel 480, and therefore, it is possible to suppress light emission at adjacent pixels, that is, electrical color mixture caused by leakage of a current to the adjacent pixels, in addition to obtaining the effect in the above-described embodiment. Moreover, the organic bank also becomes discontinuous for every pixel 480, and therefore, the leaked light entering the organic bank by being emitted in a horizontal direction is not emitted from the adjacent pixels if the leaked light does not pass the interface of many layers. Thus, it is also possible to suppress optical color mixture.

In the present embodiment, the organic EL display device in which the same kinds of organic layers are formed on the entire display region is described. However, the organic EL display device in which organic layers are formed for every pixel having different wave regions of emitted light may also be used.

Various modification examples and correction examples can be conceived by those skilled in the art in the category of the idea of the invention. Accordingly, it is understood that the modification examples and the correction examples also belong to the scope of the invention as long as they have the gist of the invention.

What is claimed is:

1. An organic EL display device comprising:
   a lower electrode which is disposed for every pixel disposed in a matrix shape within a display region, and in which a potential is controlled for the every pixel;
   an upper electrode which is disposed so as to cover the display region;
   a first organic layer which is disposed between the lower electrode and the upper electrode and includes a plurality of layers including a light emitting layer formed of an organic material that emits light;
   a metal wire that extends between the pixels within the display region; and
   a second organic layer having the same layers as the layers which are included in the first organic layer, wherein
   the second organic layer comes into contact with a part of the metal wire and does not come into contact with the first organic layer, and
   the upper electrode comes into contact with the metal wire in the periphery of the second organic layer.

2. The organic EL display device according to claim 1, further comprising:
   a flattening film formed of the organic material covering a circuit which is formed on a substrate and includes the metal wire and a thin film transistor; and
   an insulating bank that covers an end portion of the lower electrode which is formed on the flattening film among the lower electrode, the first organic layer, and the upper electrode, and electrically insulates the pixels,
   wherein the upper electrode comes into contact with the metal wire through a contact hole opened in the flattening film and the insulating bank.

3. The organic EL display device according to claim 1, wherein the upper electrode continuously comes into contact with the metal wire within the display region along the metal wire.

4. The organic EL display device according to claim 1, wherein the metal wire vertically and horizontally extends so as to surround each of the pixels within the display region.

5. The organic EL display device according to claim 1, wherein the first organic layer has the same light emitting layer in all of the pixels within the display region.

* * * * *